United States Patent [19]

Dapore et al.

[11] Patent Number: 4,864,639
[45] Date of Patent: Sep. 5, 1989

[54] SELF-TEST DEVICE AND METHOD HAVING AN AMPLIFIER CONVERTED INTO AN OSCILLATOR

[75] Inventors: Mark A. Dapore, Cincinnati; Daniel A. Titus, Batavia, both of Ohio

[73] Assignee: Cincinnati Electronics Corporation, Cincinnati, Ohio

[21] Appl. No.: 101,488

[22] Filed: Sep. 28, 1987

[51] Int. Cl.$^4$ .................. H04B 17/00; H03F 1/40
[52] U.S. Cl. .................. 455/226; 455/67; 455/341; 330/112; 331/59; 324/83 R; 324/83 FE
[58] Field of Search .................. 455/226, 67, 341, 115, 455/110; 330/2, 112, 291; 331/59; 324/77 R, 79 R, 83 R, 83 FE, 123 C, 123 R:124

[56] References Cited

U.S. PATENT DOCUMENTS

| | | | |
|---|---|---|---|
| 3,012,197 | 12/1961 | Peterson et al. | 330/112 |
| 3,038,070 | 6/1962 | MacDonald | 331/59 |
| 3,196,357 | 7/1965 | Hoag | 331/59 |
| 3,484,692 | 12/1969 | Lode | 330/112 |
| 3,755,741 | 8/1973 | Stover | 455/226 |
| 4,001,732 | 1/1977 | Gundry | 331/59 |
| 4,060,767 | 11/1977 | Lohrmann | 455/226 |
| 4,124,780 | 11/1978 | Ogita | 455/226 X |
| 4,360,928 | 11/1982 | Campbell | 455/226 |

Primary Examiner—Robert L. Griffin
Assistant Examiner—Ralph E. Smith
Attorney, Agent, or Firm—Lowe, Price, LeBlanc Becker & Shur

[57] ABSTRACT

An FM receiver is self tested by connecting a positive feedback network in circuit with a wideband, front end r.f. amplifier of the receiver, so that the amplifier is converted into an oscillator. R.f. and i.f. characteristics of the receiver are determined by comparing the amplitude of an i.f. signal with a predetermined reference value while the amplifier is converted to an oscillator. Noise characteristics of the receiver are determined by comparing the amplitude of an audio frequency signal of the receiver with a predetermined value while the amplifier is converted to an oscillator and the amplifier derives an unmodulated r.f. output. Baseband characteristics of the receiver are determined by varying a reactance in the positive feedback path to impose FM on r.f. oscillations derived by the amplifier and by comparing the amplitude of the output of the audio frequency amplifier with a predetermined value. By varying the value of the reactance in the feedback loop, the oscillating frequency is swept to determine the center operating frequency and i.f. bandwidth of the r.f. amplifier.

28 Claims, 2 Drawing Sheets

SELF-TEST DEVICE AND METHOD HAVING AN AMPLIFIER CONVERTED INTO AN OSCILLATOR

FIELD OF INVENTION

The present invention relates generally to a method of and apparatus for self-testing devices including an amplifier and, more particularly, to performing such self tests by selectively connecting a positive feedback circuit to the amplifier to convert the amplifier to an oscillator.

BACKGROUND ART

Many electronic devices, for example, FM radio receivers used for military purposes, presently include self-test arrangements. Typically, the self-test arrangement for an FM radio receiver includes an auxiliary oscillator that is connected to an r.f. front-end amplifier during a self-test operation. The oscillator is responsive to a modulator and control switches. The switches are connected to the modulator and oscillator to cause the modulator to be sequenced through a series of steps. In the first step, the oscillator supplies a constant frequency, unmodulated signal to the r.f. amplifier which drives i.f. circuitry, that in turn feeds a frequency detector that drives an audio frequency circuit. Responses from the i.f. and audio frequency circuits are derived and compared with reference values to determine the r.f. and noise characteristics of the receiver. Then, the oscillator is modulated to supply an FM modulated input to the r.f. amplifier. The audio frequency response is again derived under these circumstances and compared with a reference value to determine the receiver detection characteristics, as well as the center frequency and band width of the r.f. amplifier.

While the prior art arrangement functions satisfactorily, it has several disadvantages because of the substantial number of components which must be added. The additional components result in added cost, weight and size; they can also adversely affect reliability. The added weight and size have an adverse effect on portability, which is an important factor in many radio receivers, particularly military-type receivers.

It is, accordingly, and object of the present invention to provide a new and improved apparatus for and method of self-testing devices including amplifiers.

Another object of the invention is to provide a new and improved method and apparatus for self-testing devices including amplifiers, wherein relatively few additional components are needed for the self-test function.

Still another object of the invention is to provide a new and improved device having an amplifier and self-test capabilities, wherein the self testing is achieved with a very small number of added components.

A further object of the invention is to provide a relatively inexpensive, low-volume and low-weight arrangement for self-testing devices including an amplifier.

THE INVENTION

In accordance with one aspect of the present invention, a device having an amplifier normally responsive to an external signal and circuitry responsive to an output signal of the amplifier includes a positive feedback circuit connected to the amplifier to convert the amplifier to an oscillator used for self testing the device. The amplitude of a signal derived by the amplifier while it is converted to an oscillator is compared with a reference value to provide the self test function.

In a preferred embodiment, the device is a radio receiver and the amplifier is an r.f. amplifier normally connected to be responsive to an r.f. signal derived by an antenna transducer. The amplifier is connected to a positive feedback circuit while the receiver is being tested so r.f. oscillations are derived by the r.f. amplifier in place of replica of an r.f. signal derived by the transducer. The amplitude of the r.f. oscillations is detected while the receiver is being tested. The detected amplitude is compared with a predetermined value to signal the condition of the receiver. The feedback path is selectively angle modulated so the r.f. amplifier selectively derives an angle-modulated r.f. signal. The modulation level of the angle-modulated signal is detected and compared with a predetermined value to determine noise level and detection characteristics of the receiver. When no modulation is imposed on the r.f., the level of the detected signal is a measure of the receiver noise characteristics.

The detecting characteristics are determined by comparing the detected level with a predetermined amplitude while the positive feedback path is reactance modulated to frequency modulate the r.f. oscillations supplied by the r.f. amplifier to a mixer in the i.f. circuitry. The feedback path is reactance modulated at plural frequencies so the amplifier derives plural modulation frequencies in sequence. The modulation amplitude at each of the frequencies is detected and compared with a predetermined amplitude for each of the modulation frequencies. To monitor the bandwidth and center frequencies of the r.f. amplifier, the modulation amplitudes at the different frequencies are compared with each other. The oscillation frequencies resulting in output amplitudes that are a predetermined percentage (e.g. 30 db) below the output amplitude in the center of the amplifier band, are detected to determine the extreme frequencies for the amplifier pass band. From the extreme frequencies, the pass band, i.e., band width, and center frequency of the amplifier are determined.

In accordance with an additional aspect of the invention, a device having a built-in test apparatus includes an amplifier normally responsive to an external signal and circuitry responsive to an output signal of the amplifier. A positive feedback path is selectively connected in circuit with the amplifier so the amplifier oscillates and is unresponsive to the external signal while test connection for the device are established. The circuitry responds to oscillations generated by the amplifier to derive an output signal having a variable amplitude indicative of a tested state of the device. The amplitude of the output signal is compared with a reference level therefor while the test connections are established.

In accordance with still another aspect of the invention, a radio receiver includes a wideband tuned r.f. amplifier having an input terminal for a modulated r.f. input signal and an output terminal on which an r.f. output signal is derived, in combination with i.f. means responsive to a local oscillator and the r.f. output signal for deriving an i.f. signal, detector means responsive to the i.f. signal for deriving a variable amplitude baseband signal indicative of modulation of the r.f. output signal, and positive feedback means selectively connected to the r.f. amplifier for converting the r.f. amplifier to an r.f. oscillator while the receiver is undergoing testing.

The receiver is tested by comparing the amplitude of at least one of the i.f. and baseband signals with a predetermined value therefor while the positive feedback means is connected to the amplifier to convert it to an r.f. oscillator.

In accordance with this aspect of the invention, the amplitude of the i.f. signal is detected and compared with a predetermined value therefor to monitor the r.f. and i.f. characteristics of the receiver. Also, or alternatively, the amplitude of the baseband signal is detected and compared with a predetermined value therefor to monitor the receiver noise and detection characteristics.

To monitor noise characteristics, the amplifier and positive feedback means are connected so the r.f. output signal is not modulated while the positive feedback circuit is connected to the r.f. amplifier during the self-test operation. At this time, the baseband signal should have only very low amplitude levels commensurate with the receiver noise level. Indicator means responsive to the baseband signal amplitude under these circumstances indicates a defective receiver in response to the baseband signal amplitude being in excess of a predetermined value.

To monitor detection characteristics, the r.f. output signal is modulated at a predetermined frequency. To these ends, the positive feedback path includes a variable reactance, e.g., a varactor diode, that is varied to control the frequency of FM modulation at the amplifier r.f. output. The modulation amplitude is detected by monitoring the output of the receiver FM detector and comparing it, at each of the modulation frequencies, with predetermined level.

The present invention thus eliminates the need for an external oscillator and modulator. The control functions required for connecting the feedback path to the amplifier and control of the modulation frequency and amplitude are provided by a microprocessor. Since microprocessors are frequently included in many FM radio receiver, particularly military receivers for the purpose of signal processing, the number of components added to the receiver resulting from the self-test arrangement is minimized. This reduces the cost, volume and weight of the receiver to achieve the self-test function with high reliability.

The above and still further objects, features and advantages of the present invention will become apparent upon consideration of the following detailed description of a specific embodiment thereof, especially with the accompanying drawing.

DETAILED DESCRIPTION OF THE PREFERRED EMBODIMENT

Figure 1:
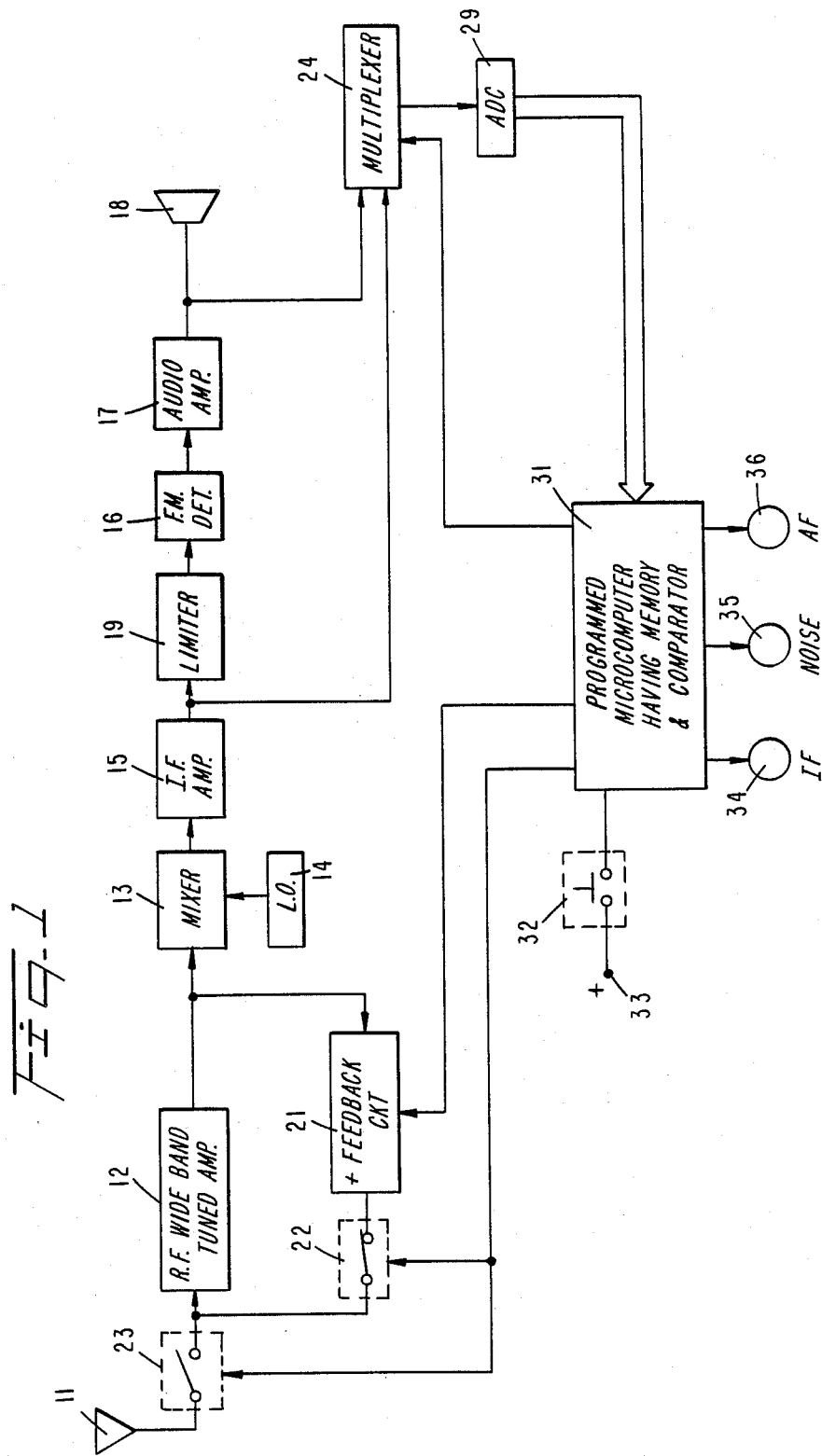
FIG. 1 is a block diagram of an FM radio receiver including the present invention.

The FM radio receiver illustrated in FIG. 1 includes the usual elements, viz: antenna 11, r.f., wideband tuned front end amplifier 12, mixer 13, local oscillator 14, i.f. amplifier 15, limiter 19, FM detector or discriminator 16, audio amplifier 17 and speaker 18. In normal operation, antenna 11 transduces an electromagnetic wave into an amplifier 12. Amplifier 12 derives a replica of the wave transduced by antenna 11 and which is converted into an intermediate frequency (i.f.) signal by mixer 13, which is also responsive to local oscillator 14. The i.f. output of mixer 13 is amplified by i.f. amplifier 15 which derives an output signal having a fixed predetermined center frequency and FM modulation that is a replica of the FM modulation on the signal transduced by antenna 11. The FM modulation is limited in amplitude by limiter 19 and converted into a baseband signal having a variable amplitude by FM detector 16 which drives baseband amplifier 17, usually for audio frequencies. Typically, amplifier 17 drives speaker 18 to provide the user with an aural signal.

In accordance with the present invention, the conventional receiver is modified so that amplifier 12 is converted into an oscillator, to provide the receiver with a self-test function. To these ends, positive feedback circuit 21 is selectively connected between the output and input terminals of amplifier 12 by closing switch 22, connected in circuit with the positive feedback circuit and the input and output terminals of the amplifier. Simultaneously with switch 22 being closed, switch 23, in series between antenna 11 and the input of amplifier 12, is preferably open-circuited, so that the amplifier does not respond to the signal from the antenna. However, in many instances, switch 23 can be excluded because there is sufficient feedback energy from amplifier 12 via feedback circuit 21 and switch 22 to "swamp" out the signal from antenna 11.

To monitor the responses of the i.f. amplifier 15 and audio amplifier 17 while switch 22 is closed, signal multiplexer 24 is provided. While switch 22 is closed, either the audio signal from audio amplifier 17 or a signal indicative of the i.f. signal strength from i.f. amplifier 15 is selectively connected to A/D converter 29 which converts the amplitude of the AC signal fed to it to a digital word.

Control of switches 22 and 23, and multiplexer 24 is in response to output signals of programmed microcomputer 31, of the usual type including a microprocessor, read-only memory (ROM) and random-access memory (RAM). The microprocessor in microcomputer 31 includes an accumulator and associated decision logic, as well as the usual input and output buses. A primary function of microcomputer 31 is to process the audio signal. In addition, the ROM in microcomputer 31 stores a program which sequences the microcomputer so that switches 22 and 23, and multiplexer 24 are activated to provide the self-test function as well as analyze the self-test results for pass/fail criteria. In addition, the ROM stores a fast fourier transform (FFT) program for enabling a spectral analysis to be performed on the output of A/D converter 29. The FFT enables the amplitude of AC signals from amplifier 15, coupled through multiplexer 24, to be determined.

Microcomputer 31 responds to an operator closing switch 32 to supply a positive DC voltage at terminal 33 to the microcomputer. Closing switch 32 energizes micro-computer 31 to activate the ROM to initiate the self-test operations. The ROM issues commands to close switch 22 and open switch 23. This results in a constant amplitude, unmodulated r.f. signal, at the center frequency of amplifier 12, being applied to mixer 13. If the r.f. amplifier and mixer are properly functioning, i.f. amplifier 15 should derive a constant amplitude output signal having no FM modulation imposed thereon. To test if the amplitude of the output of amplifier 15 is above a predetermined value, and thereby to test for the proper operation of amplifier 12, mixer 13 and amplifier 15, microcomputer 31 controls multiplexer 24 so that the analog output of amplifier 15 is coupled to A/D converter 29 which converts it into a digital signal. The output of analog-to-digital converter 29 is amplitude detected in conjunction with the FFT stored in the ROM of microcomputer 31. The amplitude detected value representing the AC input to multiplexer 24 is compared in microcomputer 31 with a signal stored in the microcomputer ROM. In response to the amplitude of the output of i.f. amplifier 15 being less than a predetermined value, the comparator included in the microprocessor of microcomputer 31 supplies a latched flag to visual indicator 34, preferably a light-emitting diode (LED). If the amplitude of the output of i.f. amplifier 15 exceeds the predetermined level, LED 34 is not energized.

The program in microcomputer 31 is then stepped to the next operation wherein the receiver noise level is tested. To this end, microcomputer 31 maintains switches 22 and 23 in the same state and activates multiplexer 24 so the output of audio amplifier 17 is coupled to analog-to-digital converter 29. Thereby, a constant amplitude, unmodulated signal is derived by i.f. amplifier 15 and a low-level, noise-indicating signal is derived by amplifier 17 and coupled to A/D converter 29. If the noise level of the device is proper, analog-to-digital converter 29 should derive output signals having an amplitude less than a predetermined value under these circumstances. During this test, the value for the AC input to converter 29 is compared with a predetermined value in the comparator of the microprocessor included in microcomputer 31. In response to the value for the AC input to converter 29 exceeding the predetermined value, the microprocessor derives a latched flag which energizes LED indicator 35 to signal the operator that the receiver has an unsatisfactory noise level. If the value for the AC input to converter 29 is less than a predetermined value under these conditions, LED 35 is not activated.

The program of microcomputer 31 then advances to the next operation wherein the detection and baseband characteristics of the receiver are tested. To perform such a test, microcomputer 31 maintains switches 22, and 23 in the same state while activating multiplexer 24 so the output of audio amplifier 17 is coupled to the input of A/D converter 29. Under these conditions, an electronically variable reactance in positive feedback path 21 is square wave modulated at one or several sequentially derived audio frequencies by an output of microcomputer 31. Varying the reactance in feedback path 21 frequency modulates the r.f. oscillations supplied by amplifier 12 to mixer 13. The frequency modulation imposed on the output of mixer 13 is translated by audio amplifier 17 into one or more audio frequencies in sequence. Each audio frequency is converted to a digital word stream by A/D converter 29 and converted by microcomputer 31 to a digital amplitude using FFT based digital signal processing. In response to the amplitude or amplitudes representing a signal level or levels being less than a predetermined value while the reactance is modulated at any of the audio frequencies, microcomputer 31 supplies LED 36 with a latched flag to indicate an audio frequency malfunction.

The program in microcomputer 31 then advances to the next step if none of the latched flags for activating LED's 34-36 is derived. If none of LED's 34-36 is activated, the self-test operation has indicated that the receiver is in proper working condition. The bandwidth and center frequency of amplifier 12 are then measured while the ROM in microcomputer closes switch 22, opens switch 23 and sets multiplexer 24 so the output is applied to converter 29. Under these conditions the ROM in microcomputer 31 sequentially supplies a gamut of square wave frequencies to the variable reactance in circuit 21. The frequencies applied to the reactance extend beyond and through the expected bandpass of amplifier 12. Thereby oscillations are sequentially applied to mixer 13 at each frequency in the gamut. The amplitudes of the oscillations at the different frequencies in the gamut are likely to differ, depending upon whether the frequency is in or out of the bandpass of amplifier 12. The amplitude at each frequency in the gamut is detected by microcomputer 31 since a representation of the AC amplitude at the output of the i.f. amplifier is fed to the microcomputer by multiplexer 24 and converter 29. To determine the bandwidth of amplifier 12, microcomputer 31 calculates the average AC amplitude of the outputs of amplifier 15 while oscillations are derived from amplifier 12 in the region of the known approximate center of the bandpass of amplifier 12. Microcomputer 31 computes the average value of the AC amplitudes at the output of amplifier 15 for oscillation frequencies of amplifier 12 removed from the approximate bandpass center frequency of amplifier 12 to determine the cut off frequencies of amplifier 12. The exact center frequency of amplifier 12 is determined by microcomputer 31 from the two cut off frequencies, either as the geometric or arithmetic mean thereof. Microcomputer supplies signals indicative of these values to a conventional digital display (not shown). In the next step, the receiver is activated by microcomputer 31 to its normal operating condition, to command switch 22 to open, and switch 23 to close. The operator then utilizes the receiver in the normal manner with microcomputer 31 providing the signal processing function for the received signal.

Figure 2:
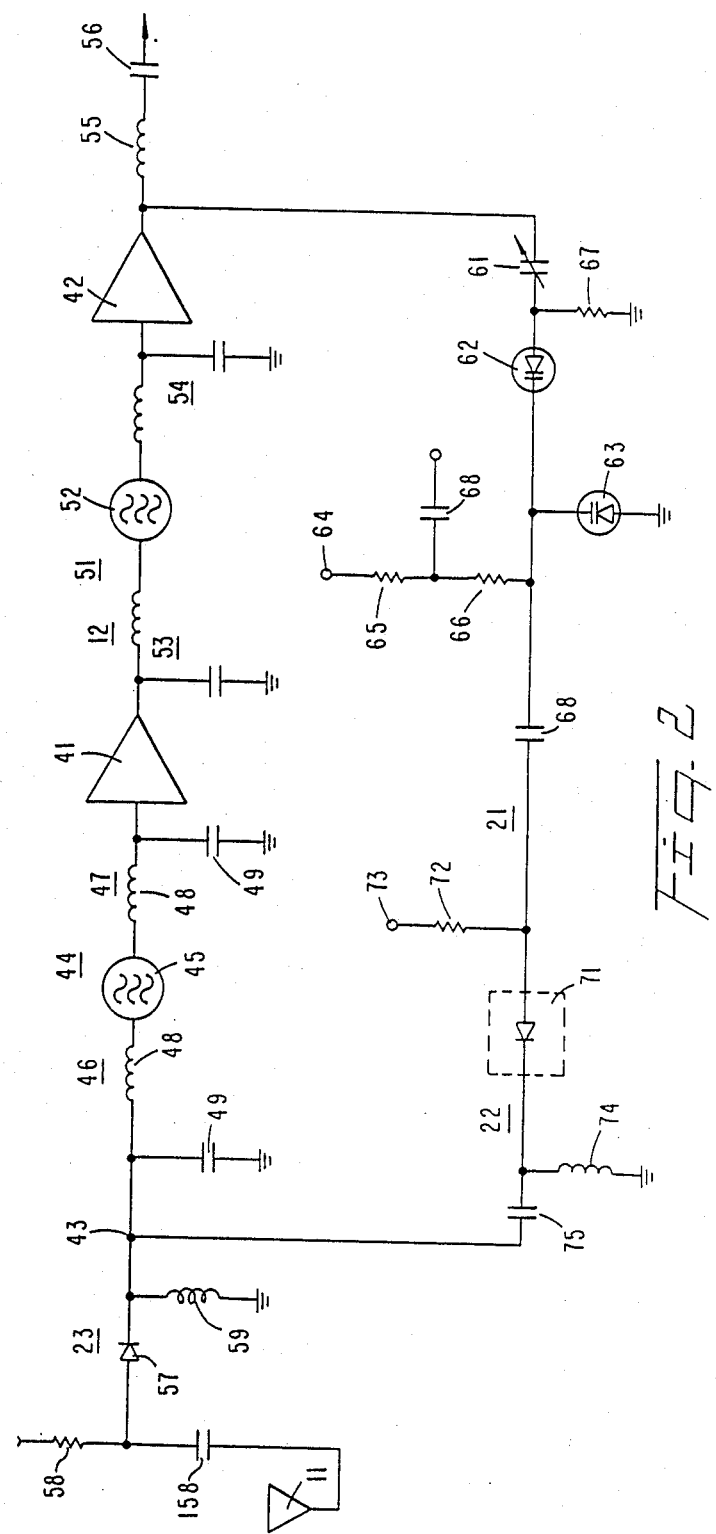
FIG. 2 is a circuit diagram of an r.f. amplifier which is selectively converted to an oscillator in the receiver of FIG. 1.

Reference is now made to FIG. 2 of the drawing, a circuit diagram of r.f. wideband tuned amplifier 12 in combination with positive feedback circuit 21, and switches 22 and 23. Basically, amplifier 12 is a two-stage amplifier, including a bandpass filter in the input circuit of each amplifier, while feedback circuit 21 includes a series path containing a fixed capacitor and a voltage-controlled capacitor, and a shunt path including a voltage-controlled capacitor. Switches 22 and 23 are electronic PIN "T" attenuators.

To these ends, amplifier 12 includes cascaded r.f., wideband polarity-reversing amplifiers 41 and 42. Amplifier 41 includes an input terminal responsive to a signal at terminal 43, as coupled to the amplifier input via a wideband, bandpass filter circuit 44 including surface acoustic wave (SAW) r.f. bandpass filter 45, connected to terminal 43 and the input of amplifier 41 by way of matching networks 46 and 47, each of which includes series inductor 48 and shunt capacitor 49. The output of amplifier 41 is connected to the input of amplifier 42 by way of a similar wideband, r.f. wideband filter circuit 51, including surface acoustic wave filter 52, and matching networks 53 and 54, constructed in the same manner as matching networks 46 and 47. Frequency stability is enhanced by the use of SAW filters 45 and 52 connected to the inputs of amplifiers 41 and 42. Filters 45 and 52 have the same or slightly displaced center frequencies and the same bandwidth, depending upon the desired gain and bandwidth of amplifier 12. In either case, the r.f. signal at terminal 43 is amplified through the bandwidth of the amplifier including filters 45 and 52 to have the same polarity at the output of amplifier 42 as at terminal 43.

The output signal of amplifier 42 is coupled via series inductor 55 and series capacitor 56 to an input of mixer 13. Terminal 43 is connected to antenna 11 via r.f. coupling capacitor 158 and switch 23, preferably comprising a PIN "T" attenuator including diode 57 and coupling resistor 58 which is connected to respond to an output of microcomputer 31. A return path for the signal supplied by microcomputer 31 to resistor 58 is provided through diode 57 to ground via inductor 59, having a sufficiently high impedance in the pass band of amplifier 12 to function as an open circuit. In normal operation, after the test sequence has been completed, microcomputer 31 forward biases diode 57 via resistor 58, so that terminal 43 is connected to antenna 11. During the test sequence, however, microcomputer 31 reverse biases resistor 58, whereby diode 57 is back-biases and antenna 11 is decoupled from terminal 43. Alternatively, terminal 43 could be connected directly to antenna 11 because the positive feedback signal from amplifier 42 to amplifier 41 by way of feedback circuit 21 is usually sufficient to "swamp" out the signal from antenna 11, as applied to amplifier 41 via terminal 43.

Feedback path 21 couples the signal at output terminal 43 of amplifier 42 to the input terminal of amplifier 41 with sufficient amplitude and with the correct polarity to cause oscillations at the output of amplifier 42 to be established at a common resonant frequency of filters 45 and 52. If filters 45 and 52 have different resonant frequencies, the signal at the output of amplifier 42 has a center frequency equal to the geometric mean of the resonant frequencies of the filters 45 and 52. Filters 45 and 52 have sufficient bandpass to couple frequency-modulated waves transduced by antenna 11 to the input of mixer 13. The bandpass of filters 45 and 52 is such that the frequency modulation imposed on oscillations produced by amplifier 12 by varying the reactance in positive feedback network 21 is coupled from the output of amplifier 42 to the input of mixer 13.

To these ends, feedback circuit 21 includes series capacitor 61, series varactor diode 62 and shunt varactor diode 63. Capacitor 61 is preset, at the time of manufacture, in a range of values, for example, from 0.5 to 10 picofarads, to provide positive feedback between the output of amplifier 42 and the input of amplifier 41. Varactor diodes 62 and 63 are variable, voltage-controlled capacitors having a nominal capacitance that is selectively varied to frequency modulate the r.f. output of amplifier 42. Diodes 62 and 63 are DC biased by a DC voltage applied to terminal 64. The voltage at terminal 64 is coupled to the cathodes of diodes 62 and 63 by series resistors 65 and 66, with a return path being provided for the anode of diode 62 to ground by resistor 67. The magnitude of the DC voltage at resistor 64 is set, at the time of manufacture, in conjunction with the setting of capacitor 61 to assure that positive feedback is provided from the output of amplifier 42 to the input of amplifier 41 at the center frequency of amplifier 12 and the FM frequencies which modulate feedback path 21.

To frequency modulate feedback path 21, the capacitances of varactor diodes 62 and 63 are varied at an frequency by a square wave output of microcomputer 31. One or several audio frequencies are coupled by the microcomputer through coupling capacitor 68 to a junction between resistors 65 and 66, thence to diodes 62 and 63 at the one or several audio frequencies. To derive the audio frequency, the microprocessor in microcomputer 31 is responsive to a clock source, typically having a frequency in the 1-2 megahertz range. The microprocessor includes frequency division circuits for enabling one or several audio frequencies to be derived and coupled to capacitor 68, to frequency modulate the capacitances of varactor diodes 62 and 63 at the one or several audio frequencies. Because a pair of varactor diodes 62 and 63 is provided, frequency modulation over a relatively wide range of audio frequencies can be provided. If, however, it is necessary to provide modulation only over a narrow range of audio frequencies, shunt varactor diode 63 can be eliminated.

Diodes 62 and 63 respond to the audio frequency modulation supplied to them to vary the phase shift introduced by positive feedback circuit 21 between the output of amplifier 42 and the input of amplifier 41. The phase changes associated with the capacitance changes of varactor diodes 62 and 63 cause the frequency of the wave derived from amplifier 42 to be accordingly modulated, i.e., to angle modulate the r.f. output of amplification.

The DC signal at terminal 64 is decoupled from the remainder of the circuit by capacitor 61 and AC coupling capacitor 68, connected in series between the junction of diodes 62 and 63 and switch 22. Capacitor 68 has a sufficiently large value that it does not introduce significant phase shift in feedback path 21 between the output of amplifier 42 and the input of amplifier 41.

Switch 22 is similar to switch 23, except that switch 22 is open-circuited while switch 23 is closed, and vice versa. To these ends, switch 22 includes diode 71, having an anode connected through coupling resistor 72 to terminal 73, which is responsive to the output of microcomputer 31 that forward biases diode 71 while positive feedback circuit 21 is effectively connected between the input and output terminal of amplifier 12. The cathode of diode 71 is connected, for DC purposes, to ground by inductor 74, having a sufficiently high impedance through the pass band of amplifier 12 to function as and open circuit. The DC level at terminal 73 is isolated from the remainder of feedback circuit 21 and amplifier 12 by AC coupling capacitors 68 and 75, the latter of which is connected between the cathode of diode 71 and terminal 43.

The receiver of the present invention is simple and lower in cost than conventional receivers with built-in test capabilities. The lower cost results from the use of the r.f. amplifier as the essential element of the oscillator and the use of a few, relatively inexpensive passive components in the positive feedback loop. Further, the necessity for a separate controller for the oscillator is obviated through the use of a microprocessor, which is included in many modern receivers. Further, the present receiver is more reliable than prior art receivers with built-in test capabilities because it employs fewer components, as a result of the redundant use of the r.f. amplifier for the r.f. oscillator.

While there has been described and illustrated a specific embodiment of the invention, it will be clear that variations in the details of the embodiment specifically illustrated and described may be made without departing from the true spirit and scope of the invention as defined in the appended claims.

We claim:

1. An angle modulated radio receiver comprising a wideband tuned r.f. amplifier having an input terminal for a modulated r.f. input signal and an output terminal on which an r.f. output signal is derived, a local oscillator, i.f. means responsive to the local oscillator and the r.f. output signal for deriving an i.f. signal, detector means responsive to the i.f. signal for deriving a variable amplitude signal indicative of modulation on the r.f. output signal, positive feedback means selectively connected to the r.f. amplifier for converting the r.f. amplifier to an r.f. oscillator while the receiver is undergoing testing, the positive feedback means including a variable reactance, means for varying the reactance so that the r.f. output is an angle modulated test signal, and means for comparing the amplitude of at least one of the i.f. and variable amplitude signals with a predetermined value therefor while the positive feedback means is connected to the amplifier to convert it to an r.f. oscillator deriving the angle modulated test signal.

2. The angle modulated radio receiver of claim 1 wherein the means for comparing includes means for detecting the amplitude of the i.f. signal while the positive feedback means is connected to the amplifier to convert it to an r.f. oscillator, and means for comparing the detected amplitude with a predetermined value therfor.

3. The angle modulate radio receiver of claim 1 wherein the means for comparing includes means for detecting the amplitude of the variable amplitude signal while the positive feedback means is connected to the amplifier to convert it to an r.f. oscillator, and means for comparing the detected amplitude with a predetermined value therefor.

4. The angle modulated radio receiver of claim 1 wherein the means for comparing includes means for detecting the amplitude of the i.f. and variable amplitude signals while the positive feedback means is connected to the amplifier to convert it to an r.f. oscillator, and means for comparing the detected amplitudes with predetermined values therefor.

5. The angle modulated radio receiver of claim 1 wherein the amplifier and positive feedback means are connected so the r.f. output signal has no modulation thereon while the positive feedback means is connected to the amplifier to convert it to an r.f. oscillator, whereby the variable amplitude signal should have only very low amplitude levels, and indicator means for indicating a defective receiver in response to the variable amplitude signal having an amplitude in excess of a predetermined value while the positive feedback means is connected to the amplifier to convert it to an r.f. oscillator and while the r.f. signal has no modulation thereon.

6. The angle modulated radio receiver of claim 1 wherein the amplifier and positive feedback means are connected so the r.f. output signal has no modulation thereon while the positive feedback means is connected to the amplifier to convert it to an r.f. oscillator, whereby the variable amplitude signal should have only very low amplitude levels, and indicator means for indicating the receiver noise level in response to the variable amplitude signal while the positive feedback means is connected to the amplifier to convert it to an r.f. oscillator and while the r.f. signal has no modulation thereon.

7. The angle modulated radio receiver of claim 1 further including means for causing the r.f. output signal to have modulation at a predetermined amplitude imposed thereon while the positive feedback means is connected to the amplifier to convert it to an r.f. oscillator, wherein the detector means is responsive to the modulation imposed on the r.f. output signal, and indicator means for indicating a defective receiver in response to the variable amplitude signal having an amplitude of less than a predetermined value while the positive feedback means is connected to the amplifier to convert it to an r.f. oscillator.

8. The angle modulated radio receiver of claim 7 wherein the receiver is an angle modulated receiver, the detector means is an angle modulated detector, and the positive feedback means includes a variable reactance, and means for varying the reactance to impose angle modulation on the r.f. output signal while the positive feedback means is connected to the amplifier to convert it to an r.f. oscillator.

9. The angle modulated radio receiver of claim 8 wherein the reactance includes a varactor diode having variable capacitance.

10. The angle modulated radio receiver of claim 1 further including means for causing the r.f. output signal to have modulation at a predetermined amplitude imposed thereon while the positive feedback means is connected to the amplifier to convert it to an r.f. oscillator, wherein the detector means is responsive to the modulation imposed on the r.f. output signal, and indicator means for indicating baseband characteristics of the receiver in response to the variable amplitude signal while the positive feedback means is connected to the amplifier to convert it to an r.f. oscillator.

11. The angle modulated radio receiver of claim 1 further including a microcomputer including a programmed memory as well as the means for comparing, the programmed memory being responsive to an operator input for selectively establishing connections between the positive feedback means and the r.f. amplifier and between the detector means and the means for comparing while the receiver is undergoing testing.

12. The angle modulated radio receiver of claim 11 further including means for detecting the amplitude of the i.f. signal and for detecting the amplitude of the variable amplitude signal, and wherein the programmed memory responds to the operator input for establishing sequential connections between the means for comparing and the means for detecting so that the amplitudes of the i.f. and variable amplitude signals are sequentially compared while the receiver is undergoing testing.

13. The receiver of claim 1 wherein the amplifier includes active and passive elements cascaded between input and output terminals, the positive feedback means including switch means as well as series and shunt paths, the series path comprising a first voltage controlled capacitor, the shunt path including a second voltage controlled capacitor, the variable reactance including the first and second voltage controlled capacitors, the switch means being a diode responsive to a voltage source for selectively connecting the positive feedback means in circuit with the input and output terminals.

14. A method of testing an angle modulated receiver having an r.f. amplifier with a predetermined frequency passband normally responsive to a received angle modulated signal and circuitry responsive to an output signal of the amplifier comprising the steps of connecting a positive feedback circuit to the amplifier so the amplifier oscillates, activating the amplifier while the receiver is being tested so oscillations in the frequency band are derived by the amplifier in place of a replica of the received angle modulated signal modulating the feedback path to angle modulate the oscillations so the amplifier derives angle modulated oscillations in the frequency passband, detecting the modulation amplitude of the angle modulated oscillations, and comparing the detected modulation amplitude with another value.

15. The method of claim 14 further including the steps of detecting the amplitude of the oscillations while the device is being tested, and the comparing step comprises comparing the detected amplitude with a predetermined value therefor, and signaling the condition of the receiver in response to the comparing step.

16. The method of claim 14 wherein the feedback path is angle modulated at plural frequencies so the amplifier derives a plurality to frequency modulated signals, detecting the amplitude of the modulation at each of the frequencies, and the comparing step includes comparing the amplitude at each of the modulation frequencies with a predetermined amplitude.

17. The method of claim 14 wherein the feedback path is angle modulated at plural frequencies so the amplifier derives a plurality of frequency modulated signals, detecting the amplitude of the modulation at each of the frequencies, and the comparing step includes comparing the amplitude at the modulation frequencies with each other.

18. The method of claim 14 wherein the feedback path is angle modulated such that the amplifier derives frequencies beyond and through an expected bandpass of said amplifier, and the comparing step includes comparing the detected modulation amplitude at the frequencies beyond and through the expected bandpass of said amplifier.

19. A method of testing an angle modulated receiver having an r.f. amplifier normally responsive to a received angle modulated signal and circuitry responsive to an output signal of the amplifier for detecting and converting the angle modulated signal derived by the amplifier into a signal having amplitude variations representing the angle modulation imposed on the angle modulated signal, comprising the steps of connecting a positive feedback circuit to the amplifier so the amplifier oscillates, activating the amplifier while the receiver is being tested so oscillations in the frequency band are derived by the amplifier in place of a replica of the received angle modulated signal modulating the feedback path to angle modulate the oscillations so the amplifier derives angle modulated oscillations in the frequency band, supplying the angle modulated oscillations derived by the amplifier to the circuitry for detecting and converting so the circuitry for detecting and converting derives another signal having amplitude variations representing the angle modulated oscillations derived by the amplifier while the feedback path is being modulated, and comparing the amplitude of said another signal with another value.

20. A method of testing an angle modulated receiver having an r.f. amplifier normally responsive to a received angle modulated signal and circuitry responsive to an output signal of the amplifier for detecting and converting the angle modulated signal derived by the amplifier into a signal having amplitude variations representing the angle modulation imposed on the angle modulated signal, comprising the steps of connecting a positive feedback circuit to the amplifier so the amplifier oscillates, activating the amplifier while the receiver is being tested so oscillations in the frequency band are derived by the amplifier in place of a replica of the received angle modulated signal modulating the feedback path to angle modulate the oscillations so the amplifier derives angle modulated oscillations in the frequency band, supplying the angle modulated oscillations derived by the amplifier to the circuitry for detecting and converting so the circuitry for detecting and converting derives another signal having amplitude variations representing the angle modulated oscillations derived by the amplifier while the feedback path is being modulated, and comparing the amplitude of said another signal with another value further including detecting the modulation amplitude of the angle modulated oscillations and comparing the detected modulation amplitude with another value.

21. The method of claim 20 wherein the feedback path is angle modulated at plural frequencies so the amplifier derives a plurality to frequency modulated signals, detecting the amplitude of the modulation at each of the frequencies, and the comparing step includes comparing the amplitude at each of the modulation frequencies with a predetermined amplitude.

22. The method of claim 20 wherein the feedback path is angle modulated at plural frequencies so the amplifier derives a plurality of frequency modulated signals, detecting the amplitude of the modulation at each of the frequencies, and the comparing step includes comparing the amplitude at the modulation frequencies with each other.

23. A method of testing an angle modulated receiver for noise characteristics, the receiver having an r.f. amplifier with a predetermined frequency passband normally responsive to a received angle modulated signal and circuitry responsive to an output signal of the amplifier for detecting and converting the angle modulated signal derived by the amplifier into a signal having amplitude variations representing the angle modulation imposed on the angle modulated signal, comprising the steps of connecting a positive feedback circuit to the amplifier so the amplifier oscillates at a single frequency such that the circuitry derives a zero output signal while the receiver is operating correctly, activating the amplifier while the receiver is being tested so oscillations in the frequency band are derived by the amplifier in place of a replica of the received angle modulated signal modulating the feedback path to angle modulate the oscillations so the amplifier derives angle modulated oscillations in the frequency passband, supplying the angle modulated oscillations derived by the amplifier to the circuitry for detecting and converting so the circuitry for detecting and converting derives another signal having amplitude variations representing the angle modulated oscillations derived by the amplifier while the feedback path is being modulated, and indicating that the receiver has an excessive signal-to-noise ratio in response to said another signal having a value in excess of a predetermined level while the feedback circuit causes the amplifier to oscillate at said single frequency.

24. A method of testing an angle modulated receiver for noise characteristics, the receiver having an r.f. amplifier normally responsive to a received angle modulated signal and circuitry responsive to an output signal of the amplifier for detecting and converting the angle modulated signal derived by the amplifier into a signal having amplitude variations representing the angle modulation imposed on the angle modulated signal, comprising the steps of connecting a positive feedback circuit to the amplifier so the amplifier oscillates at a single frequency such that the circuitry derives a zero output signal while the receiver is operating correctly, activating the amplifier while the receiver is being tested so oscillations in the frequency band are derived by the amplifier in place of a replica of the received angle modulated signal modulating the feedback path to angle modulate the oscillations so the amplifier derives angle modulated oscillations in the frequency band, supplying the angle modulated oscillations derived by the amplifier to the circuitry for detecting and converting so the circuitry for detecting and converting derives another signal having amplitude variations representing the angle modulated oscillations derived by the amplifier while the feedback path is being modulated, and detecting the amplitude of said another signal while the feedback circuit causes the amplifier to oscillate at said single frequency to indicate the receiver noise level.

25. An angle modulated receiver having a built-in test apparatus, the receiver comprising an r.f. input amplifier normally responsive to a received r.f. angle modulated signal to derive an r.f. output signal, circuitry, including an angle modulated detector responsive to an output signal of the amplifier, positive feedback means including a variable reactance for the amplifier, means for selectively connecting the feedback means in circuit with the amplifier so the amplifier oscillates to derive an r.f. test output signal and is unresponsive to the received signal while establishing test connections for the device, means for controlling the reactance to impose angle modulation on the r.f. test output signal while the positive feedback means is connected to the amplifier to convert it to an r.f. oscillator, the circuitry responding to the r.f. test output signal of the amplifier to derive an output level having a variable amplitude indicative of a tested state of the receiver, and means for comparing the amplitude of the output level with another level therefor while the test connections are established.

26. The receiver of claim 25 wherein the reactance control means maintains the reactance constant while the amplifier and positive feedback means are connected so the r.f. test output signal has no modulation thereon and is at a frequency such that the output level should be at an approximately zero level while the receiver is properly operating, and indicator means for indicating a defective receiver in response to the output level having an amplitude in excess of a predetermined value while the positive feedback means is connected to the amplifier to convert it to an oscillator and while the r.f. test output signal has no modulation thereon at said frequency.

27. The receiver of claim 25 wherein the reactance control means maintains the reactance constant while the amplifier and positive feedback means are connected so the r.f. test output signal has no modulation thereon and is at a frequency such that the output level should be at an approximately zero level while the receiver is properly operating, and indicator means for indicating the receiver noise level in response to the output level while the positive feedback means is connected to the amplifier to convert it to an oscillator and while the r.f. test output signal has no modulation thereon.

28. The receiver of claim 25 wherein the receiver includes an i.f. amplifier responsive to a frequency converted replica of the r.f. output signal for deriving an i.f. signal subject to variable amplitude, means for causing the r.f. test output signal to have angle modulation at a predetermined amplitude imposed thereon while the positive feedback means is connected to the amplifier to convert it to an oscillator, wherein the i.f. amplifier means is responsive to the modulation imposed on the output signal to derive a test i.f. signal subject to variable amplitude, and indicator means for indicating a defective receiver in response to the variable amplitude test i.f. signal having an amplitude less than a predetermined value while the positive feedback means is connected to the amplifier to convert it to an oscillator.

* * * * *